(12) United States Patent
Ovshinsky et al.

(10) Patent No.: US 8,148,707 B2
(45) Date of Patent: Apr. 3, 2012

(54) OVONIC THRESHOLD SWITCH FILM COMPOSITION FOR TSLAGS MATERIAL

(75) Inventors: Stanford Ovshinsky, Bloomfield Hills, MI (US); Tyler Lowrey, West Augusta, VA (US); James D. Reed, Rochester Hills, MI (US); Semyon D. Savransky, Newark, CA (US); Jason S. Reid, San Jose, CA (US); Kuo-Wei Chang, Cupertino, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 284 days.

(21) Appl. No.: 12/637,644

(22) Filed: Dec. 14, 2009

(65) Prior Publication Data

US 2010/0163822 A1    Jul. 1, 2010

Related U.S. Application Data

(60) Provisional application No. 61/141,596, filed on Dec. 30, 2008.

(51) Int. Cl.
*H01L 29/02* (2006.01)
*H01L 29/18* (2006.01)
*H01L 45/00* (2006.01)

(52) U.S. Cl. ........... 257/2; 257/5; 257/42; 257/E29.079; 257/E29.08

(58) Field of Classification Search .................. 257/2–5, 257/42, E29.079, E29.08
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 3,748,501 A | 7/1973 | Fritzsche et al. | |
| 4,845,533 A | 7/1989 | Pryor et al. | |
| 5,166,758 A | 11/1992 | Ovshinsky et al. | |
| 5,177,567 A * | 1/1993 | Klersy et al. | 257/4 |
| 5,296,716 A | 3/1994 | Ovshinsky et al. | |
| 5,341,328 A | 8/1994 | Ovshinsky et al. | |
| 5,359,205 A | 10/1994 | Ovshinsky | |
| 5,414,271 A | 5/1995 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,596,522 A | 1/1997 | Ovshinsky et al. | |
| 5,687,112 A | 11/1997 | Ovshinsky | |
| 5,694,146 A | 12/1997 | Ovshinsky et al. | |
| 5,757,446 A | 5/1998 | Ovshinsky et al. | |
| 5,825,046 A | 10/1998 | Czubatyj et al. | |

(Continued)

OTHER PUBLICATIONS

Ovshinsky, S.R., "Reversible Electrical Switching Phenomena in Disordered Structures," Physical Review Letters 21 (20):1450-1453, Nov. 11, 1968.

(Continued)

*Primary Examiner* — Ha Tran T Nguyen
*Assistant Examiner* — Raj R Gupta
(74) *Attorney, Agent, or Firm* — Seed IP Law Group PLLC

(57) ABSTRACT

A chalcogenide alloy that optimizes operating parameters of an ovonic threshold switch includes an atomic percentage of arsenic in the range of 9 to 39, an atomic percentage of germanium in the range of 10 and 40, an atomic percentage of silicon in the range of 5 and 18, an atomic percentage of nitrogen in the range of 0 and 10, and an alloy of sulfur, selenium, and tellurium. A ratio of sulfur to selenium in the range of 0.25 and 4, and a ration of sulfur to tellurium in the alloy of sulfur, selenium, and tellurium is in the range of 0.11 and 1.

24 Claims, 5 Drawing Sheets

U.S. PATENT DOCUMENTS

| | | | |
|---|---|---|---|
| 5,912,839 | A | 6/1999 | Ovshinsky et al. |
| 6,087,674 | A | 7/2000 | Ovshinsky et al. |
| 6,671,710 | B2 | 12/2003 | Ovshinsky et al. |
| 6,714,954 | B2 | 3/2004 | Ovshinsky et al. |
| 6,795,338 | B2 | 9/2004 | Parkinson et al. |
| 6,800,504 | B2 * | 10/2004 | Li et al. ............ 438/102 |
| 7,414,883 | B2 * | 8/2008 | Gordon et al. ............ 365/163 |
| 7,864,567 | B2 * | 1/2011 | Gordon et al. ............ 365/163 |
| 2006/0118911 | A1 | 6/2006 | Kostylev et al. |
| 2006/0171194 | A1 | 8/2006 | Lowrey et al. |
| 2006/0227592 | A1 | 10/2006 | Parkinson et al. |
| 2006/0291272 | A1 | 12/2006 | Lowrey et al. |
| 2007/0096090 | A1 | 5/2007 | Dennison |
| 2007/0097739 | A1 * | 5/2007 | Happ et al. ............ 365/163 |
| 2007/0105267 | A1 | 5/2007 | Karpov et al. |

OTHER PUBLICATIONS

Ovshinsky, S.R. et al., "Amorphous Semiconductors for Switching, Memory, and Imaging Applications," IEEE Transactions on Electron Devices ED-20(2):91-105, Feb. 1973.

Fritzsche et al., "Calorimetric and Dilatometric Studies on Chalcogenide Alloy Glasses," Journal of Non-Crystalline Solids 2:148-154, 1970.

Flasck et al., "The Thermal Conductivity of Some Chalcogenide Glasses," Journal of Non-Crystalline Solids 12(3): 353-356, 1973.

Doumeng et al., "Etudes Physico-Chimiques D'Une Serie De Verres Chalcogenures Te60As25Ge13Mx (M = S OU Se)," Materials Research Bulletin 8(6):635-646, 1973.

MacKowski et al., "Structural and Electrical Properties of Some TeAsGeS Glasses," Journal of Non-Crystalline Solids 8-10:985-991, 1972.

Aitken et al., "The Effect of Te on the Physical Properties of GeAsS Glasses," Journal of Non-Crystalline Solids 326 & 327:29-36, 2003.

Hollinger et al., "ESCA Study of Molecular GeS3-xTexAs2 Glasses," Journal of Electron Spectroscopy and Related Phenomena 5(1):237-245, 1974.

* cited by examiner

OVONIC THRESHOLD SWITCH FILM COMPOSITION FOR TSLAGS MATERIAL

BACKGROUND

1. Technical Field

The present disclosure relates generally to compositions of ovonic threshold switches.

2. Description of the Related Art

A phase change memory device includes an array of memory cells, where each memory cell includes a memory element and a selection element. The memory element is a phase change material, i.e., a chalcogenide alloy that may be electrically switched between a generally amorphous and a generally crystalline state or between different detectable states of local order across the entire spectrum between completely amorphous and completely crystalline states. The state of the phase change material is also non-volatile in that, when set in a crystalline, semi-crystalline, amorphous, or semi-amorphous state representing a resistance value, that value is retained until changed by another programming event. The resistance value that is retained represents a phase or physical state of the material (e.g., crystalline or amorphous). This physical state of the phase change material is unaffected by removing electrical power.

The selection element may also be made of a chalcogenide alloy, however, unlike the memory element, the selection element does not change phase. More particularly, the selection element, which may be referred to throughout as an ovonic threshold switch, an OTS, or a switching device, does not exhibit a phase change from amorphous to crystalline. An ovonic threshold switch toggles between an "on" and "off" state depending on the amount of voltage potential applied across the phase change memory cell. The state of the ovonic threshold switch changes when a current through the ovonic threshold switch exceeds a threshold current or voltage. Once the threshold current or voltage is reached, the on state is triggered and the ovonic threshold switch is in a substantially conductive state. If the current or voltage potential drops below a threshold value, the ovonic threshold switch will return to the off state.

The behavior (including switching, memory, and accumulation) of chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. The references also describe the structural transformations from the crystalline state to the amorphous state (and vice versa), including a series of partially crystalline states in which the relative proportions of crystalline and amorphous regions may vary during the operation of electrical and optical chalcogenide materials.

The phase change material is typically formed with one or more chalcogenide elements (i.e., Group VI elements from the periodic table). Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

BRIEF SUMMARY

The present disclosure is directed to alternative chalcogenide alloy compositions that optimize the performance characteristics of chalcogenic switching devices, such as ovonic threshold switches. More particularly, the chalcogenide alloy for an ovonic threshold switch can sustain high field strengths and provide low off state leakage with stable threshold voltages, $V_{TH}$. Embodiments in accordance with the principles of the present disclosure may include binary, ternary, quaternary, and higher order chalcogenide alloys.

In accordance with one embodiment of the present disclosure, a chalcogenide alloy that optimizes operating parameters of an ovonic threshold switch is presented and includes arsenic at an atomic percentage in the range of 9 to 39, germanium at an atomic percentage in the range of 10 and 40, silicon at an atomic percentage in the range of 5 and 18, nitrogen at an atomic percentage in the range of 0 and 10, and an alloy of sulfur, selenium, and tellurium. A ratio of sulfur to selenium in the range of 0.25 and 4 and a ratio of sulfur to tellurium in the alloy of sulfur, selenium, and tellurium is in the range of 0.11 and 1.

In accordance with yet another embodiment, a chalcogenide alloy is provided that includes the composition $As_m X_q Ge_r Si_t N_z$, where m is an atomic percentage of the alloy in the range of 9 to 39, q is an atomic percentage of the alloy in the range of 17 and 60, r is an atomic percentage of the alloy in the range of 10 and 40, t is an atomic percentage of the alloy in the range of 5 and 18, and z is an atomic percentage of the alloy in the range of 0 and 10. The chalcogenide alloy also includes X is $S_a Se_d Te_g$ where a/d is in the range of 0.25 and 4 and a/g is in the range of 0.11 and 1.

Another embodiment of the present disclosure provides an ovonic threshold switch that is a chalcogenide alloy having the formula described herein. In addition, a phase change memory cell is provided that includes a phase change memory layer and an ovonic threshold switch layer formed of a chalcogenide alloy having the composition described herein. A memory is also provided that includes a wordline, a bitline, a phase change memory layer, a first electrode that separates the phase change memory layer from the wordline, and an ovonic threshold switch layer formed of a chalcogenide alloy described herein.

DETAILED DESCRIPTION

Figure 1:
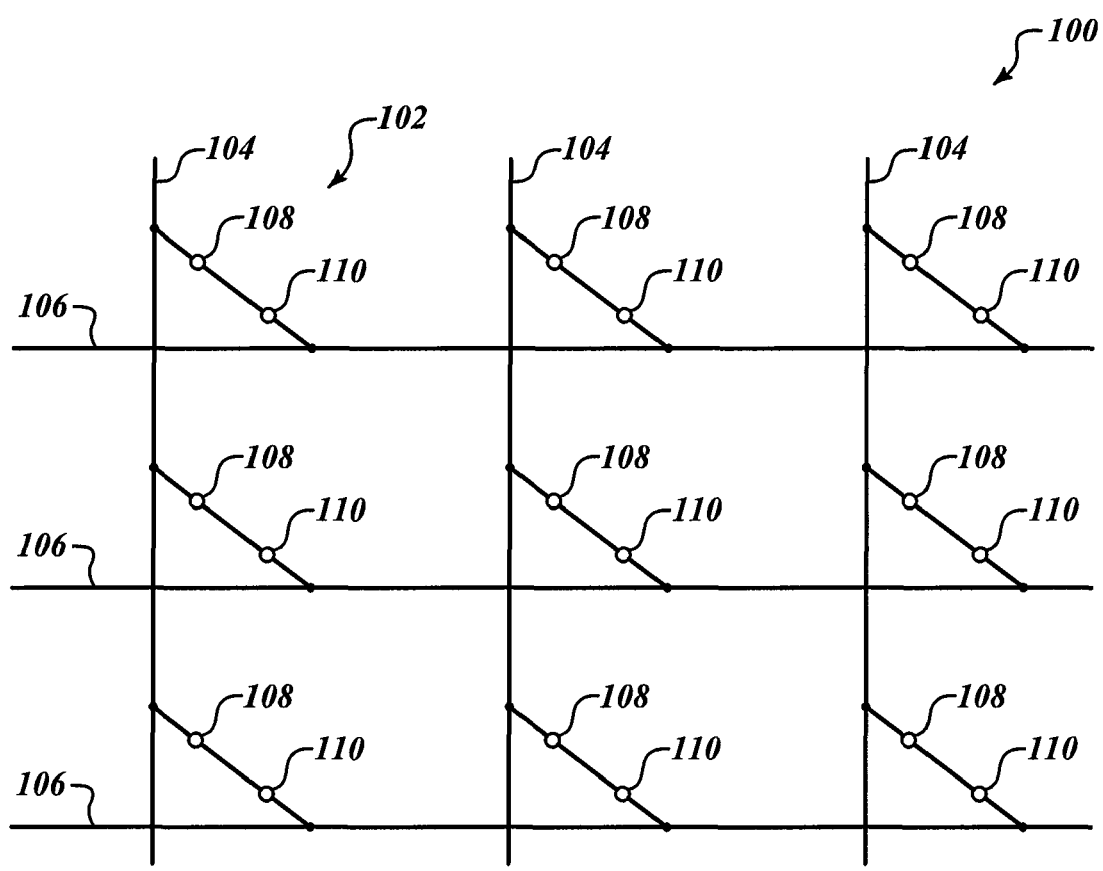
FIG. 1 illustrates a memory array.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the Figures, identical reference numbers identify similar elements or acts. The size and relative positions of features in the drawings are not necessarily drawn to scale. For example, some of the various features are arbitrarily enlarged and positioned to improve drawing legibility.

The alloy components described herein theoretically add up to an atomic percentage of 100, but the compositional ranges are determined by empirical formula.

Referring to FIG. 1, a memory array 100 includes a plurality of memory cells 102 positioned between a plurality of bit lines 104 and word lines 106. Each memory cell 102 includes an ovonic threshold switch 108 and a memory element 110. Both the ovonic threshold switch 108 and the memory element 110 may be formed of a chalcogenide composition, an alloy of elements of group VI of the periodic table, such as Te, S, or Se.

The memory element 110 may be a phase change material that switches from a high resistance state, generally amorphous, to a low resistance state, generally crystalline, upon the application of energy such as heat, light, voltage potential, or electrical current. The phase change material may be switched from completely amorphous to completely crystalline or between different detectable states of local order across the entire spectrum between completely amorphous and completely crystalline.

Programming the phase change material to alter its state or phase may be accomplished by applying voltage potentials across electrodes, thereby generating a voltage potential across the ovonic threshold switch 108 and the memory element 110. When the voltage potential is greater than a threshold voltage ($V_{TH}$) of the ovonic threshold switch 108, an electrical current may flow through the ovonic threshold switch 108 and the phase change material in the memory element 110 and may result in heating of the phase change material. This heating may alter the memory state or phase of the phase change material, thus altering the electrical characteristic of the memory element 110, e.g., the resistance. Thus, the memory material may also be referred to as a programmable resistance material.

The amorphous or semi-amorphous state may be associated with a "reset" state or a logic "0" value, while a crystalline or semi-crystalline state may be associated with a "set" state, or a logic "1" value. The resistance of memory material in the amorphous or semi-amorphous state is generally greater than the resistance of memory material in the crystalline or semi-crystalline state. It is to be appreciated that the association of reset and set with amorphous and crystalline states, respectively, is a convention and that at least an opposite convention may be adopted.

Using an electrical current, the phase change memory material may be heated to a relatively higher temperature to amorphize memory material and "reset" memory material (e.g., program memory material to "0"). Heating the volume of memory material to a relatively lower crystallization temperature may crystallize memory material and "set" memory material (e.g., program memory material to "1"). Various resistances of memory material may be achieved to store information by varying the amount of current flow and duration through the volume of memory material.

The memory elements 110 of the memory cells 102 may be connected to the word lines 106 and to the bit lines 104 through the ovonic threshold switch 108. To select a particular memory cell 102, voltage potentials may be applied across the associated bit line 104 and word line 106. The ovonic threshold switch 108 may be used to access the memory element 110 during programming or reading operations.

In contrast to the phase change memory material in the memory element 110, the chalcogenide material in the ovonic threshold switch 108 does not change state or phase upon the application of energy. Instead, the switching material used in the ovonic threshold switch 108 may be in a substantially amorphous state that may be repeatedly and reversibly switched between a higher resistance "off" state and a lower resistance "on" state. The ovonic threshold switch 108 is either on or off depending on the amount of voltage potential applied across the memory cell 102. The off state may be substantially non conductive and the on state may be substantially conductive.

The ovonic threshold switch 108 is formed of a chalcogenide alloy that provides reproducible switching at fast switching speeds. Basic principles and operational features of ovonic threshold switches are presented, for example, in U.S. Pat. Nos. 3,271,591; 5,543,737; 5,694,146; and 5,757,446; the disclosures of which are hereby incorporated by reference, as well as in several journal articles including Ovshinsky, S. R., "Reversible Electrical Switching Phenomena in Disordered Structures," *Physical Review Letters* 21:1450-1453 (1969); Ovshinsky, S. R. and Fritzsche, H., "Amorphous Semiconductors for Switching, Memory, and Imaging Applications," *IEEE Transactions on Electron Devices* ED-20:91-105 (1973); which are hereby incorporated by reference. Three-terminal ovonic threshold switch devices are disclosed, for example, in U.S. Pat. Nos. 6,969,867 and 6,967,344; which are hereby incorporated by reference.

The ovonic threshold switch 108 switches between the off and the on state by applying an electrical current or voltage potential that exceeds a threshold current or threshold voltage, $I_{TH}$ and $V_{TH}$, respectively. If a voltage potential is less than $V_{TH}$ of the ovonic threshold switch 108, then the ovonic threshold switch 108 remains in the off or highly resistive state. Little or no electrical current passes through the memory cell 102 when the ovonic threshold switch 108 is in the off state. If a voltage potential greater than $V_{TH}$ is applied, then the ovonic threshold switch 108 may switch to the on state and operate in a relatively low resistive state. In the on state, current passes through the memory cell 102 and can be used to read or program the memory element 110.

Figure 2:
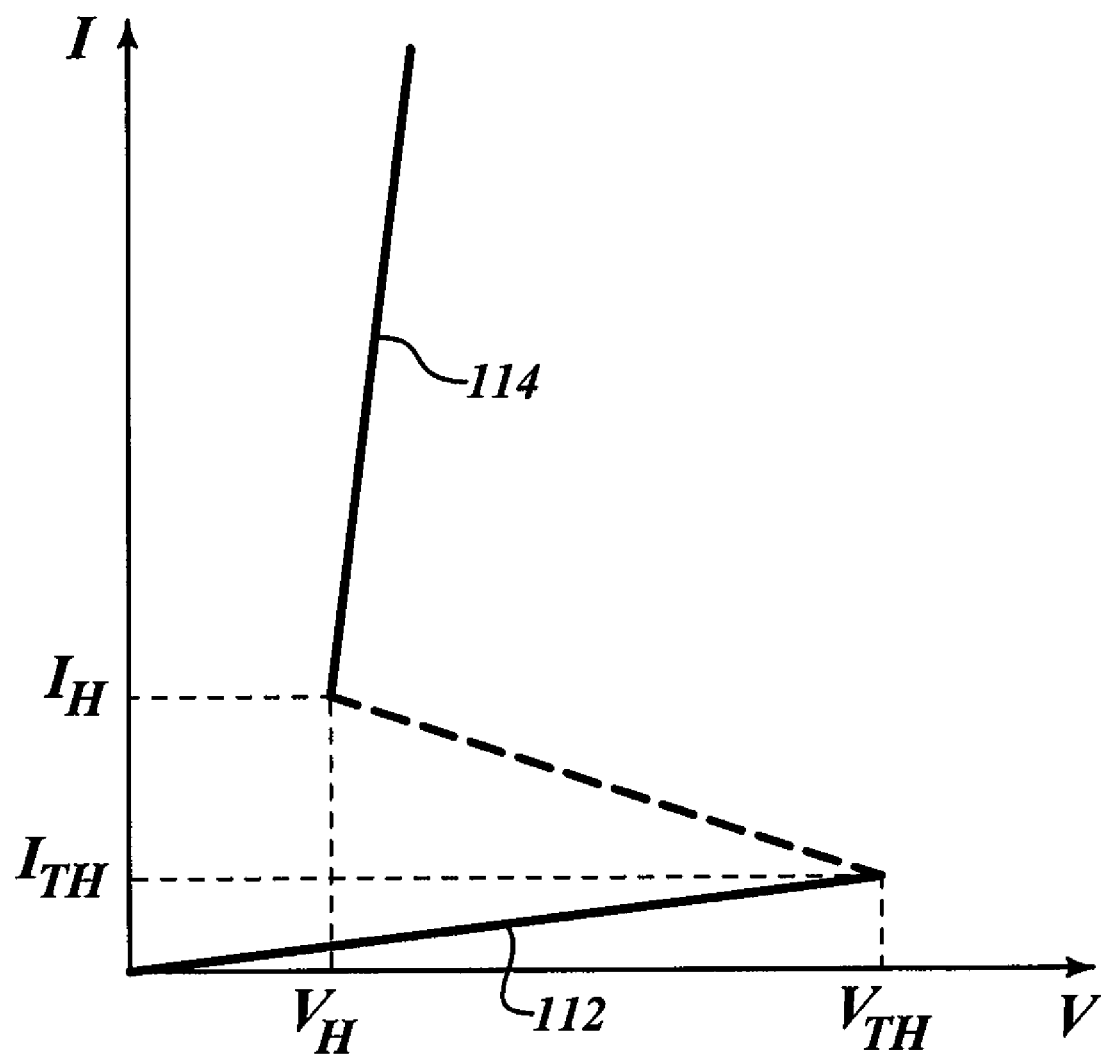
FIG. 2 illustrates a current-voltage characteristic of an ovonic threshold switch.

FIG. 2 illustrates an example I-V characteristic of the switching material in ovonic threshold switch 108. Since the switching material of the ovonic threshold switch 108 may remain in an amorphous state, the current-voltage (I-V) characteristic may remain the same throughout the operating life of the ovonic threshold switch 108.

When the voltage across the ovonic threshold switch 108 is less than the threshold voltage, $V_{TH}$, the ovonic threshold switch 108 is in a substantially nonconductive state, i.e., an off state curve 112. If a voltage potential greater than $V_{TH}$ or a current greater than $I_{TH}$ is applied, then the ovonic threshold switch 108 turns on, i.e., an on state curve 114. If the voltage potential across the ovonic threshold switch 108 is greater than $V_{TH}$, then the voltage potential across the ovonic threshold switch 108 may drop or snapback to a holding voltage potential, $V_H$.

As current passing through the ovonic threshold switch 108 increases, the voltage potential across the ovonic threshold switch 108 may remain close to $V_H$, see the on state curve 114. The ovonic threshold switch 108 may remain in the on state until the current decreases to below a holding current $I_H$. Once the current falls below $I_H$, the ovonic threshold switch 108 may turn off and return to the highly resistive state. In order to switch the ovonic threshold switch 108 back to the on state, a voltage greater than or equal to the threshold voltage must be applied across the ovonic threshold switch 108.

In the off state 112, the current across the ovonic threshold switch 108 increases only a small amount as the voltage potential is increased. When the voltage potential exceeds the $V_{TH}$ the switching material instantaneously switches from the off state to the on state, which is illustrated by the dashed line. Upon switching, the voltage through the ovonic threshold switch 108 decreases significantly to the holding voltage, $V_H$. At this point wherein voltage across the ovonic threshold switch 108 is at or near the holding voltage $V_H$, the current becomes more sensitive to changes in the voltage. Therefore, the curve of the on state 114 has a steeper slope than the off state curve 112.

The present disclosure is directed to an ovonic threshold switch film composition that can sustain high field strength and provide low off state leakage with stable threshold voltages, $V_{TH}$. The ovonic threshold switch 108 is a chalcogenide alloy that includes tellurium, sulfur, arsenic, germanium, and selenium, which will be referred to as TSLAGS. The TSLAGS ovonic threshold switch 108 composition also includes silicon and may be formed with or without nitrogen.

The TSLAGS composition for the ovonic threshold switch 108 may be formed by combining several alloys together. For example, the TSLAGS composition may be started by first forming a number of binary alloys. More specifically, an alloy of arsenic and sulfur can be prepared that has proportions ranging from 30% to 45% and from 55% to 70%, respectively. In addition, another alloy may be formed that includes arsenic and selenium having proportions ranging from 30% to 45% and from 55% to 70%, respectively. An additional alloy may be formed that includes arsenic and tellurium combined having proportions ranging from 30% to 45% and from 55% to 70%, respectively. In one embodiment, these binary chalcogenide alloys of arsenic/sulfur, arsenic/selenium, and arsenic/tellurium are $As_2S_3$, $As_2Se_3$, and $As_2Te_3$, respectively.

After forming the binary alloys of arsenic/sulfur, arsenic/selenium, and arsenic/tellurium, a quaternary alloy comprising arsenic, sulfur, selenium, and tellurium may be formed. For example, the binary alloys of arsenic/sulfur, arsenic/selenium, and arsenic/tellurium can be combined to form a single alloy of As, Se, S, Te, in which the element-pair sulfur/selenium have proportions ranging from 20% to 80% and from 20% to 80%, respectively. In addition, the element-pair of sulfur/tellurium have proportions ranging from 10% to 50%, and from 50% to 90%, respectively, and the element-pair of selenium/tellurium have proportions ranging from 10% to 50% and from 50% to 90%, respectively.

Therefore, quaternary alloys of arsenic/sulfur/selenium/tellurium may also be formed according to the previously described proportions. More particularly, sulfur, selenium, and tellurium are interchangeable so that the proportions of these three elements to each other may be varied with in the parameters discussed above with respect to tertiary combinations with the binary alloys arsenic/sulfur, arsenic/selenium, and arsenic/tellurium. The elements sulfur, selenium, and tellurium may be used interchangeably in the percentages described above since these elements form similar crystalline structures and arrange in the same lattice positions.

In order to improve thermal robustness of these tertiary and quaternary alloys, germanium may be added in the range of 10% to 40% and silicon may be added in the range of 5% to 18%. Germanium and silicon may be incorporated in various ways, such as composite-target incorporation, co-sputtering, and metal organic chemical vapor deposition (MOCVD). The incorporation of silicon provides compatibility with high-temperature integrated circuit back-end fabrication processing.

Additionally, the incorporation of nitrogen, $N_2$, into the ovonic threshold switch 108 alloy composition improves the alloy's leakage characteristics, the stability of the alloy's threshold voltage, the alloy's thermal robustness, and the alloy's cycle life. Nitrogen may be added to the TSLAGS ovonic threshold switch alloys above in the range of 0% to 10% to enhance the ovonic threshold switch 108 characteristics. Nitrogen may be incorporated through reactive sputtering, composite-target incorporation, or other suitable processes.

This TSLAGS ovonic threshold switch composition having silicon with or without the inclusion of nitrogen balances the key functional requirements and minimizes off-state leakage and sub-threshold I-V swing, variation of the threshold voltage over many cycles, drift of the threshold voltage with delay time between pulses, and optimizes cycle life and operating current densities. In addition, the TSLAGS composition provides high thermal robustness needed for integration into back-end fab-processing.

Figure 3:
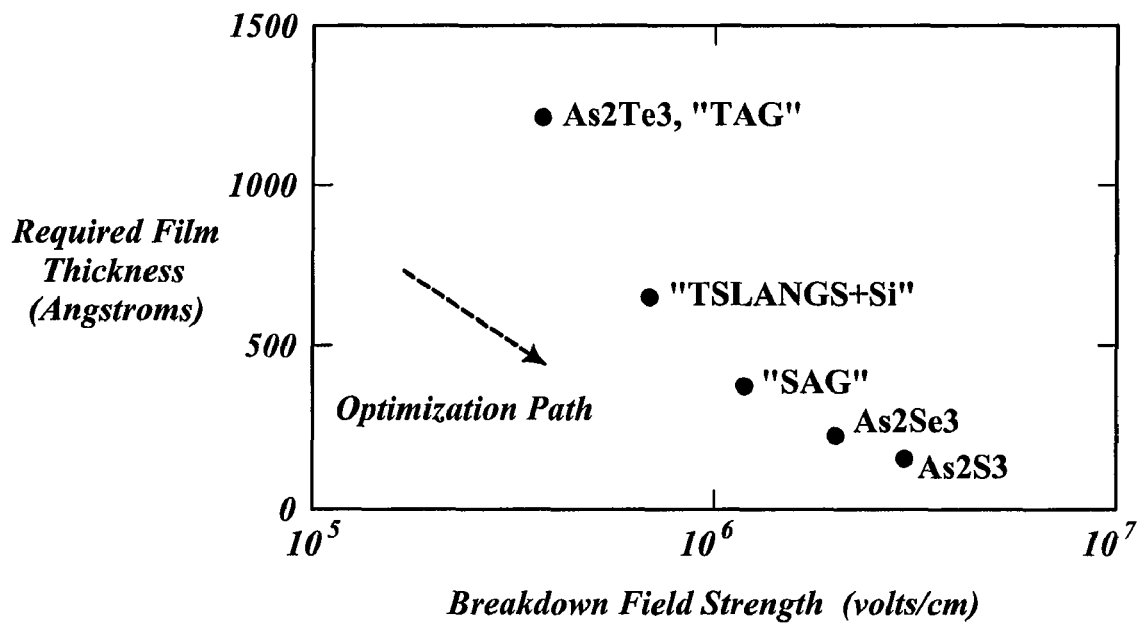
FIG. 3 is a graph illustrating a relationship between breakdown field strength and film thickness of ovonic threshold switch compositions.

Breakdown field strengths are the major intrinsic property that relates to the threshold voltage needed for switching of ovonic threshold switches. As illustrated in FIG. 3, different ovonic threshold switch compositions have different breakdown field strengths. Traditional binary chalcogenide alloys, such as $As_2S_3$ and $As_2Se_3$ have relatively high field strengths, between $1 \times 10^6$ and $1 \times 10^7$ volts/centimeter. Strong field strength alloys, such as $As_2S_3$ and $As_2Se_3$, require less film thickness to be deposited than weak field strength alloys, in order to achieve a given threshold voltage target. Other binary chalcogenide alloys, such as $As_2Te_3$ have relatively low field strengths, between $1 \times 10^5$ and $1 \times 10^6$ volts/centimeter. Therefore $As_2Te_3$ alloys require thicker films to achieve desired threshold voltages.

In one embodiment, the TSLAGS ovonic threshold switch composition with nitrogen and silicon can achieve a threshold voltage, $V_{TH}$, of 4.5V at a film thickness of 600 Angstroms. The breakdown field strength of this TSLAGS composition is not as high as the $As_2S_3$ and $As_2Se_3$ alloys and not as low as the $As_2Te_3$ alloys. Therefore, the TSLAGS composition does not require a film thickness as large as the alloy, $As_2Te_3$.

Other critical performance parameters for ovonic threshold switch applications include thermal robustness and off-state leakage. Chalcogenide alloys must be thermally robust in order to be feasibly integrated into a semiconductor process sequence, due to high-temperature steps that occur during back-end steps of device fabrication. It is advantageous to maximize the temperature an alloy can withstand before sublimating into the surrounding space, delaminating from adjacent film layers, or otherwise forfeiting its desired electrical properties. An alloy should be able to withstand temperatures of at least 300-350 degrees Celsius for integration into most existing process technologies.

Figure 4:
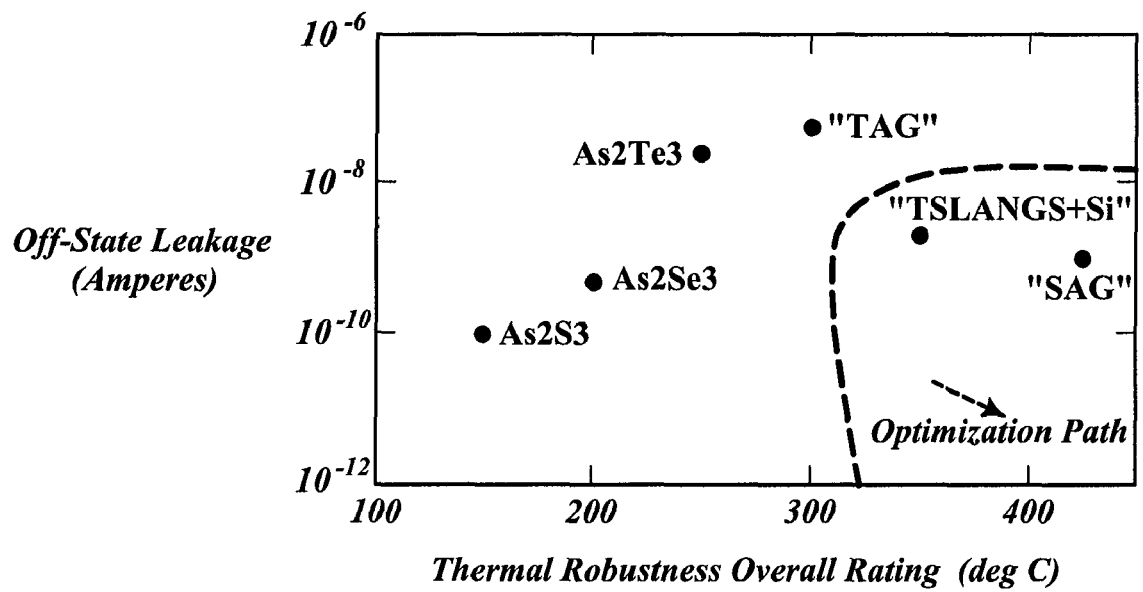
FIG. 4 is a graph illustrating a relationship between thermal robustness and off-state leakage currents for ovonic threshold switch compositions.

As illustrated in FIG. 4, the alloy, $As_2S_3$, has the lowest thermal robustness at around 150 degrees Celsius. In addition, the alloys $As_2Te_3$ and $As_2Se_3$ yield a thermal robustness rating less than 300 degrees Celsius. Adding germanium to $As_2Te_3$ and $As_2Se_3$, "TAG" and "SAG", respectively, increases the robustness ratings to at or above 300 degrees Celsius. A higher proportion of germanium in the whole chalcogenide alloy results in improved thermal robustness. For example, incorporating 40% germanium results in significantly less delamination after an anneal at 350 degrees Celsius than 10% germanium.

Advantageously, the TSLAGS composition with nitrogen and silicon also achieves a desirable thermal robustness of approximately 350 degrees Celsius. A higher proportion of silicon also improves the thermal robustness of the chalcogenide alloy. For example, incorporating 10% silicon into the whole alloy reduces occurrence of delaminations during an anneal at 350 degrees Celsius, as compared to only 5% silicon.

Another parameter that is optimized by the TSLAGS ovonic threshold switch material having silicon and formed with or without nitrogen is the off-state leakage current. By minimizing the off-state leakage current, the power consumption of unselected memory elements 102 is minimized. The off-state leakage current is strongly related to the alloy's field strength, i.e., the higher the field strength the lower the off-state leakage current. Incorporation of nitrogen, in particular, reduces the off-state leakage current of the alloy. For example, an inclusion of 2% nitrogen can decrease the off-state leakage current.

Advantageously, introduction of nitrogen also improves the thermal robustness of the ovonic threshold switch. A higher proportion of nitrogen, such as 4%, reduces the occurrence of delamination at an anneal of 350 degrees Celsius, as compared to 2% nitrogen.

In addition to the improved thermal robustness, the TSLAGS composition optimizes ovonic threshold switch performance by having a desirable field strength and therefore a lower off-state leakage current. As an example, an application involving a large memory arrays may require an ovonic threshold switch to have a diameter of 150 nm (Area=$1.8*10^{-10}$ cm$^2$) and a maximum off-state leakage of about $5\times10^{-9}$ Amperes. The TSLAGS composition with nitrogen and silicon satisfies the leakage requirements for this application and achieves the desired thermal robustness specifications.

Figure 5:
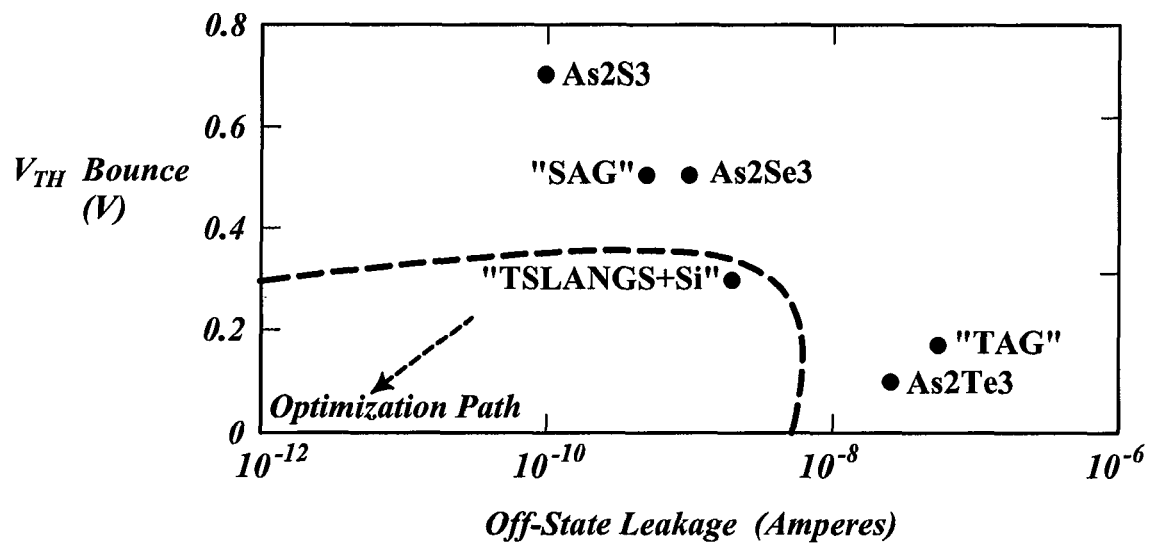
FIG. 5 is a graph illustrating a relationship between off-state leakage currents and voltage threshold bounce for ovonic threshold switch compositions.

Another parameter that should be minimized in order to optimize performance of the ovonic threshold switch 108 is the bounce of the threshold voltage, $V_{TH}$, i.e., the variation or range between switching cycles. A $V_{TH}$-bounce of 0.3 Volts is considered the highest-acceptable amount of variation. As illustrated in FIG. 5, high field strength alloys, such as $As_2S_3$ have a high $V_{TH}$-bounce, while lower field strength alloys, such as $As_2Te_3$ tend to have less $V_{TH}$-bounce. The TSLAGS composition with nitrogen and silicon achieve the desired off-state leakage current while having an acceptable $V_{TH}$-bounce of approximately 0.3 Volts. In one embodiment, the measurement for $V_{TH}$-bounce was performed by applying 30 consecutive square pluses of 500 ns width and capturing the $V_{TH}$-bounce with an oscilloscope.

Figure 6:
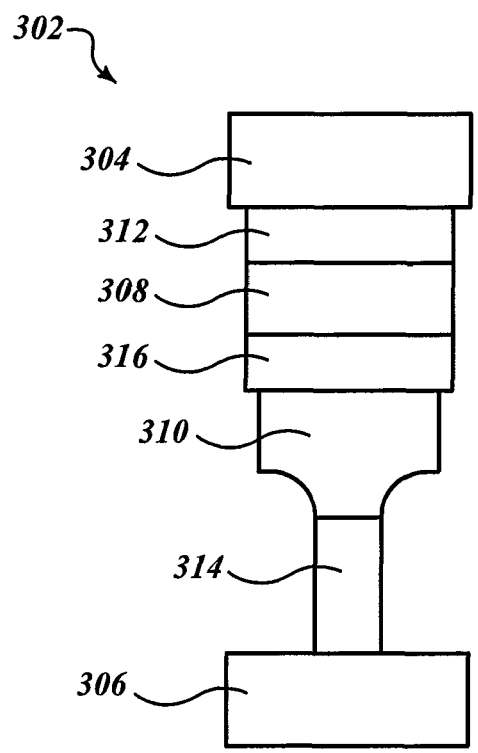
FIG. 6 illustrates an enlarged cross-sectional view of a phase change memory cell according to one embodiment of the present disclosure.

Referring to FIG. 6, a phase change memory cell 302 includes a phase change layer 310 and a TSLAGS ovonic threshold switch 308 having silicon formed with or without nitrogen. The ovonic threshold switch 308 is positioned between a top and a bottom electrode, 312 and 314, respectively. A middle electrode 316 is located between the phase change layer 310 and the ovonic threshold switch 308. The top electrode 312 is aligned with a bitline 304 and separates the bitline 304 from the ovonic threshold switch 308. The phase change layer 310 is in direct contact with the bottom electrode 314, which is in direct contact with a wordline 306.

The phase change layer 310 is typically formed with one or more chalcogenide elements (i.e., Group VI elements from the periodic table), as described above. One common chalcogenide combination is GST (germanium-Antimony-tellurium). However, any known suitable phase change material may be used.

The bitline and wordline layers 304, 306 can be of any conductive material, and are copper in one embodiment. The top and bottom electrode layers 312, 314 also can be of any conductive material. If the bitline and wordline layers 304, 306 are copper, then the top and bottom electrode layers 312, 314 preferably are copper barrier materials to prevent diffusion of the copper into the ovonic threshold switch layer 308. Some examples of copper barrier materials that can be employed include cobalt, ruthenium, tantalum, tantalum nitride, indium oxide, tungsten nitride, titanium, titanium tungsten, titanium nitride, silicon carbide, polycrystalline silicon, or other suitable conductors or resistive conductors compatible with ovonic threshold switch 308.

Programming of the phase change memory cell 302 occurs by pulses of current applied between the bitline 304 and the wordline 306. In one embodiment, the programming current rises from zero to the "reset" current value and holds the "reset" current value for up to 100 ns to melt the phase change layer 310. In some embodiments, in order to obtain effective cooling of the molten phase change layer 310, the current pulse decreases to 50%-80% of the "reset" current value for 10-100 ns before returning to zero. The reduction in the programming current to 50-80% of the reset current value ensures that the ovonic threshold switch layers 308 remains in the on state, i.e. conductive while the phase change layer 310 begins cooling. The step down in programming current more effectively quenches the phase change layer 310 to a vitreous (amorphous) state by removing the heat in the phase change layer 310 through the highly conductive ovonic threshold switch 308 to the thermal sinks of the bitline 304 and wordline 306.

The cooling stage determines if the phase change layer 310 solidifies in a high or low resistive state. A faster cooling process arranges the phase change layer 310 in the high resistance state, the "reset" state. A slower cooling process arranges the phase change layer 310 in the low resistance state, the "set" state.

Figure 7:
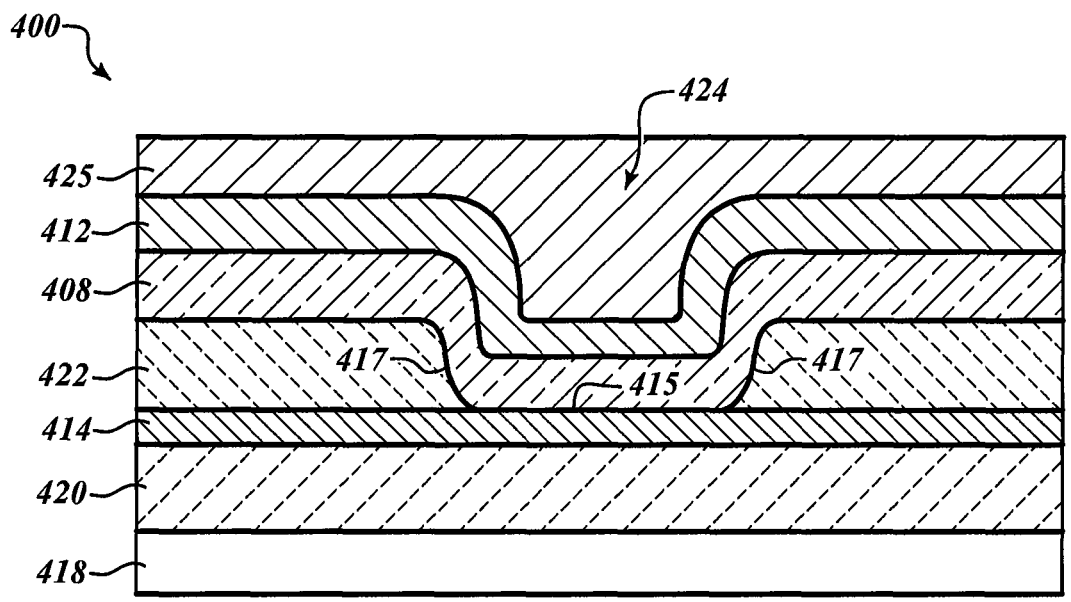
FIG. 7 illustrates an enlarged cross-sectional view of an ovonic threshold switch according to another embodiment of the present disclosure.

In one embodiment, an ovonic threshold switch 400 may be formed as illustrated in FIG. 7. A first oxide layer 420 may be deposited or grown on a substrate 418, which may be a silicon wafer. The first oxide layer 420 may be silicon dioxide or any other suitable insulating material. In one embodiment, the first oxide layer 420 is 4000 Angstroms thick (400 nanometers). Subsequently, a bottom electrode layer 414 is deposited over the first oxide layer 420 and may have a thickness of 500 Angstroms (50 nanometers). In one embodiment, the bottom electrode layer 414 is 397 Angstroms (39.7 nanometers) in thickness. The bottom electrode 414 may be formed of any suitable conductive material as described above.

Subsequently, a second oxide layer 422 may be deposited over the bottom electrode layer 414. The second oxide layer 422 may also be a silicon dioxide or other suitable insulating layer.

The layers on the substrate 418 may then be subjected to a densification process at 525 degrees Celsius for one minute. After the densification process is complete, a photoresist layer (not shown) may be deposited over the bottom electrode layer 414 to define a pore or via region 424. After a pattern and etch step to remove portions of the second oxide layer 422, a top surface 415 of the bottom electrode 414 is exposed by the via region 424. The via region 424 is defined by sidewalls 417. The photoresist layer may be removed after the via region 424 is formed.

In one embodiment, a dilute hydrogen fluoride pore clean may be used to prepare the second oxide layer 422 for deposition of an ovonic threshold switch layer 408. The ovonic threshold switch layer 408 is a deposition of a TSLAGS composition having silicon with or without nitrogen according to an embodiment the present disclosure. The ovonic threshold switch layer 408 may be formed by sputter deposition with reactive nitrogen to a thickness of 675 Angstroms (67.5 nanometers). The TSLAGS ovonic threshold switch film may be formed using other thin film deposition techniques such as, chemical vapor deposition or physical vapor deposition. In one embodiment the ovonic threshold switch layer 408 includes 8% silicon and has a thickness of 679 Angstroms. Preferably, the ovonic threshold switch layer 408 conforms to the sidewalls 417 of the via 424 and the top surface 415 of the bottom electrode 414. The ovonic threshold switch layer 408 may directly contact the bottom electrode 414 on the top surface 415.

Subsequently, a top electrode 412 is deposited over the ovonic threshold switch layer 408 and may be 406 Angstroms in thickness. In addition, a probe pad metal layer 426 may be deposited over the top electrode 412 and in the via 424. Photoresist layers and etch steps may be used to define active areas and to define contact pads.

The ovonic threshold switch 400 may then be heated in a convection oven anneal process at 350° C. for thirty minutes. It should be noted that this is an exemplary embodiment and other suitable methods may be used to form the ovonic threshold switch 400.

Figure 8:
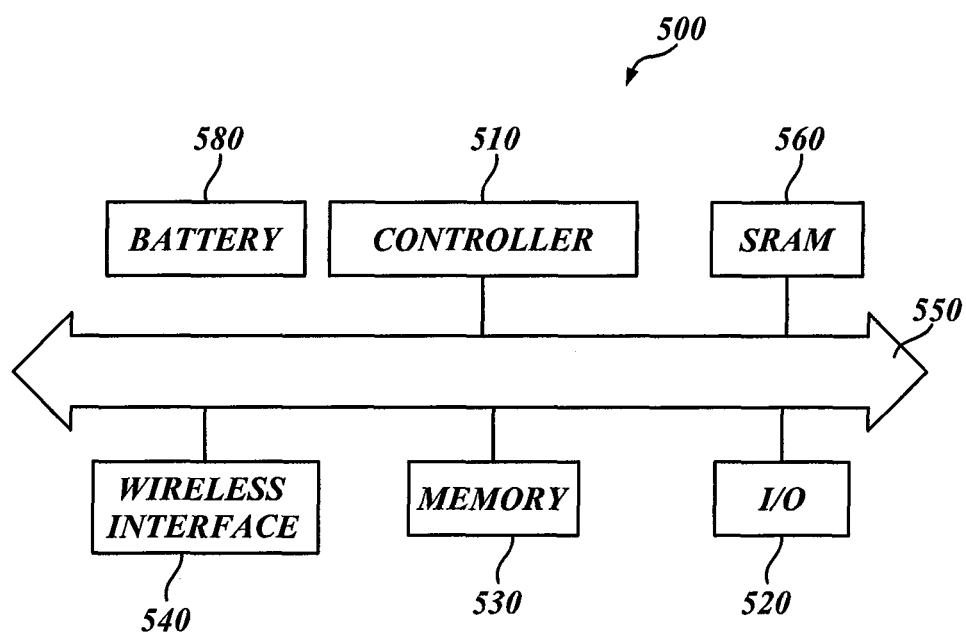
FIG. 8 is a block diagram of a system that includes a phase change memory having an ovonic threshold switch.

Turning to FIG. 8, a portion of a system 500 in accordance with an embodiment of the present disclosure is described. System 500 may be used in wireless devices such as a personal digital assistant, a laptop or portable computer with wireless capability, a web tablet, a wireless telephone, a pager, an instant messaging device, a digital music player, a digital camera, or other devices that may be adapted to transmit and/or receive information wirelessly. The system 500 may be used in any of the following systems: a wireless local area network (WLAN) system, a wireless personal area network (WPAN) system, or a cellular network, although the scope of the present invention is not limited in this respect.

The system 500 may include a controller 510, an input/output (I/O) device 520 (e.g., a keypad, display), static random access memory (SRAM) 460, a memory 530, and a wireless interface 540 coupled to each other via a bus 550. A battery 480 may be used in some embodiments. It should be noted that the scope of the present invention is not limited to embodiments having any or all of these components.

The controller 510 may comprise, for example, one or more microprocessors, digital signal processors, microcontrollers, or the like. The memory 530 may be used to store messages transmitted to or by system 500. The memory 530 may also optionally be used to store instructions that are executed by controller 510 during the operation of system 500, and may be used to store user data. The memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. The system 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

EXAMPLES

Example 1

One example of the TSLAGS material having nitrogen and 8% silicon formed as a 500 Angstrom thick film with a 150 nm diameter achieved an average threshold voltage of 3.29 Volts, an average holding voltage of 1.02 Volts, an average voltage snapback of 1.90, and a current snapback of 0.39 milliamperes.

In one embodiment, the TSLAGS composition with silicon and nitrogen may comprise an arsenic concentration in the range of 9-39%, a germanium concentration in the range of 10-40%, a silicon concentration in the range of 5-18%, a nitrogen concentration in the range of 0-10%, and a combination of selenium, sulfur, and tellurium in a concentration in the range of 17-60%. The ratio of sulfur to selenium is in the range of 0.25 and 4 and the ratio of sulfur to tellurium is in the range of 0.11 and 1. In these examples, the percentages are atomic percentages which total 100% of the atoms of the constituent elements.

In one embodiment, the ovonic threshold switch 108 is a chalcogenide composition of $As_{25-27}S_{5-6}Se_{12-13}Te_{28-30}Ge_{17-19}Si_{7-10}N_{0-5}$. In alternative embodiments, the ovonic threshold switch 108 may be $As_{25}S_{5.5}Se_{12.2}Te_{28.1}Ge_{17.8}Si_{7.1}N_{4.1}$, $As_{26.17}S_{5.78}Se_{12.75}Te_{29.38}Ge_{18.56}Si_{7.37}$, $As_{25.4}S_{5.6}Se_{12.3}Te_{28.6}Ge_{18.1}Si_{9.6}$, and $As_{25.53}S_{5.6}Se_{12.37}Te_{28.69}Ge_{18.18}Si_{9.64}$. It should be noted that impurities may be incorporated into any of the alloys during formation. For example, in the alloy composition $As_{25}S_{5.5}Se_{12.2}Te_{28.1}Ge_{17.8}Si_{7.1}N_{4.1}$, 0.4% of the total composition is an impurity.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A chalcogenide alloy, comprising:

$As_m X_q Ge_r Si_t N_z$ wherein:
m is an atomic percentage of the alloy in the range of 9 to 39;

q is an atomic percentage of the alloy in the range of 17 and 60;
r is an atomic percentage of the alloy in the range of 10 and 40;
t is an atomic percentage of the alloy in the range of 5 and 18;
z is an atomic percentage of the alloy in the range of 0 and 10;
X is $S_a Se_d Te_g$ wherein,
a/d is in the range of 0.25 and 4; and
a/g is in the range of 0.11 and 1.

2. The chalcogenide alloy of claim 1, comprising: $As_{25-27}S_{5-6}Se_{12-13}Te_{28-30}Ge_{17-19}Si_{7-10}N_{0-5}$.

3. The chalcogenide alloy of claim 1, comprising: $As_{25}S_{5.5}Se_{12.2}Te_{28.1}Ge_{17.8}Si_{7.1}N_{4.1}$.

4. The chalcogenide alloy of claim 1, comprising: $As_{26.17}S_{5.78}Se_{12.75}Te_{29.38}Ge_{18.56}Si_{7.37}$.

5. The chalcogenide alloy of claim 1, comprising: $As_{25.53}S_{5.6}Se_{12.37}Te_{28.69}Ge_{18.18}Si_{9.64}$.

6. The chalcogenide alloy of claim 1, comprising: $As_{25.4}S_{5.6}Se_{12.3}Te_{28.6}Ge_{18.1}Si_{9.6}$.

7. An ovonic threshold switch, comprising:
a chalcogenide alloy having the following formula:

$$As_m X_q Ge_r Si_t N_z$$

wherein:
m is an atomic percentage of the alloy in the range of 9 to 39;
q is an atomic percentage of the alloy in the range of 17 and 60;
r is an atomic percentage of the alloy in the range of 10 and 40;
t is an atomic percentage of the alloy in the range of 5 and 18;
z is an atomic percentage of the alloy in the range of 0 and 10;
X is $S_a Se_d Te_g$ wherein,
a/d is in the range of 0.25 and 4; and
a/g is in the range of 0.11 and 1.

8. The ovonic threshold switch of claim 7, comprising: $As_{25-27}S_{5-6}Se_{12-13}Te_{28-30}Ge_{17-19}Si_{7-10}N_{0-5}$.

9. The ovonic threshold switch of claim 7, comprising: $As_{25}S_{5.5}Se_{12.2}Te_{28.1}Ge_{17.8}Si_{7.1}N_{4.1}$.

10. The ovonic threshold switch of claim 7, comprising: $As_{26.17}S_{5.78}Se_{12.75}Te_{29.38}Ge_{18.56}Si_{7.37}$.

11. The ovonic threshold switch of claim 7, comprising: $As_{25.53}S_{5.6}Se_{12.37}Te_{28.69}Ge_{18.18}Si_{9.64}$.

12. The ovonic threshold switch of claim 7, comprising: $As_{25.4}S_{5.6}Se_{12.3}Te_{28.6}Ge_{18.1}Si_{9.6}$.

13. A phase change memory cell, comprising:
a phase change memory layer; and
an ovonic threshold switch layer formed of a chalcogenide alloy, comprising:

$$As_m X_q Ge_r Si_t N_z$$

wherein:
m is an atomic percentage of the alloy in the range of 9 to 39;
q is an atomic percentage of the alloy in the range of 17 and 60;
r is an atomic percentage of the alloy in the range of 10 and 40;
t is an atomic percentage of the alloy in the range of 5 and 18;
z is an atomic percentage of the alloy in the range of 0 and 10;
X is $S_a Se_d Te_g$ wherein,
a/d is in the range of 0.25 and 4; and
a/g is in the range of 0.11 and 1.

14. The phase change memory cell of claim 13, comprising: $As_{25-27}S_{5-6}Se_{12-13}Te_{28-30}Ge_{17-19}Si_{7-10}N_{0-5}$.

15. The phase change memory cell of claim 13, comprising: $As_{25}S_{5.5}Se_{12.2}Te_{28.1}Ge_{17.8}Si_{7.1}N_{4.1}$.

16. The phase change memory cell of claim 13, comprising: $As_{26.17}S_{5.78}Se_{12.75}Te_{29.38}Ge_{18.56}Si_{7.37}$.

17. The phase change memory cell of claim 13, comprising: $As_{25.53}S_{5.6}Se_{12.37}Te_{28.69}Ge_{18.18}Si_{9.64}$.

18. The phase change memory cell of claim 13, comprising: $As_{25.4}S_{5.6}Se_{12.3}Te_{28.6}Ge_{18.1}Si_{9.6}$.

19. A memory, comprising:
a wordline;
a bitline;
a phase change memory layer;
a first electrode that separates the phase change memory layer from the wordline;
an ovonic threshold switch layer formed of a chalcogenide alloy, comprising:

$$As_m X_q Ge_r Si_t N_z$$

wherein:
m is an atomic percentage of the alloy in the range of 9 to 39;
q is an atomic percentage of the alloy in the range of 17 and 60;
r is an atomic percentage of the alloy in the range of 10 and 40;
t is an atomic percentage of the alloy in the range of 5 and 18;
z is an atomic percentage of the alloy in the range of 0 and 10;
X is $S_a Se_d Te_g$ wherein,
a/d is in the range of 0.25 and 4; and
a/g is in the range of 0.11 and 1;
a second electrode that separates the ovonic threshold switch from the phase change memory layer; and
a third electrode that separates the ovonic threshold switch from the bitline.

20. The memory of claim 19, comprising: $As_{25-27}S_{5-6}Se_{12-13}Te_{28-30}Ge_{17-19}Si_{7-10}N_{0-5}$.

21. The memory of claim 19, comprising: $As_{25}S_{5.5}Se_{12.2}Te_{28.1}Ge_{17.8}Si_{7.1}N_{4.1}$.

22. The memory of claim 19, comprising: $As_{26.17}S_{5.78}Se_{12.75}Te_{29.38}Ge_{18.56}Si_{7.37}$.

23. The memory of claim 19, comprising: $As_{25.53}S_{5.6}Se_{12.37}Te_{28.69}Ge_{18.18}Si_{9.64}$.

24. The memory of claim 19, comprising: $As_{25.4}S_{5.6}Se_{12.3}Te_{28.6}Ge_{18.1}Si_{9.6}$.

* * * * *